United States Patent
Dyckman et al.

(10) Patent No.: US 7,271,681 B2
(45) Date of Patent: Sep. 18, 2007

(54) CLEARANCE HOLE SIZE ADJUSTMENT FOR IMPEDANCE CONTROL IN MULTILAYER ELECTRONIC PACKAGING AND PRINTED CIRCUIT BOARDS

(75) Inventors: Warren D. Dyckman, Peekskill, NY (US); Gary LaFontant, Elmont, NY (US); Edward R. Pillai, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/160,785

(22) Filed: Jul. 8, 2005

(65) Prior Publication Data

US 2007/0008049 A1    Jan. 11, 2007

(51) Int. Cl.
*H03H 7/38*    (2006.01)
(52) U.S. Cl. .................. 333/33; 333/17.3; 333/263
(58) Field of Classification Search .......... 333/17.3, 333/32–34, 263
See application file for complete search history.

(56) References Cited

U.S. PATENT DOCUMENTS

| | | | | |
|---|---|---|---|---|
| 5,797,765 | A * | 8/1998 | Barnett et al. | 439/63 |
| 6,023,211 | A * | 2/2000 | Somei | 333/246 |
| 6,486,755 | B2 * | 11/2002 | Aruga | 333/246 |
| 6,787,710 | B2 * | 9/2004 | Uematsu et al. | 174/261 |
| 6,950,066 | B2 * | 9/2005 | Hendler et al. | 343/700 MS |
| 7,045,719 | B1 * | 5/2006 | Alexander et al. | 174/262 |
| 2005/0146390 | A1 * | 7/2005 | Baek | 333/33 |

* cited by examiner

Primary Examiner—Robert Pascal
Assistant Examiner—Kimberly R Glenn
(74) Attorney, Agent, or Firm—Ira D. Blecker; Hoffman, Warnick & D'Alessandro, LLC (57) ABSTRACT

The present invention provides a technique for adjusting the size of clearance holes for impedance control in multilayer electronic packaging and printed circuit boards. The method comprises: providing parameters for a structure having a clearance hole and at least one via passing through the clearance hole; calculating a characteristic impedance for the at least one via; and adjusting at least a size of the clearance hole until the characteristic impedance for the at least one via is approximately equal to a desired characteristic impedance.

11 Claims, 8 Drawing Sheets

| Material | Dielectric Const. | X-Opening(μm) | Y-Opening(μm) | Via Pitch(μm) | Via Diameter(μm) | Diff. Impedance |
|---|---|---|---|---|---|---|
| ALUMINA | 9.80 | 1300.00 | 2000.00 | 600.00 | 100.00 | 100.01 |
| HPGC | 5.00 | 575.00 | 950.00 | 300.00 | 75.00 | 97.97 |
| SLC | 3.50 | 260.00 | 470.00 | 150.00 | 60.00 | 95.50 |
| HYPERBGA | 2.70 | 210.00 | 390.00 | 130.00 | 50.00 | 98.23 |
| DUROID | 2.20 | 2809.00 | 4109.00 | 1300.00 | 609.60 | 99.29 |
| BT | 3.80 | 3009.00 | 4209.00 | 1200.00 | 609.60 | 102.52 |

CLEARANCE HOLE SIZE ADJUSTMENT FOR IMPEDANCE CONTROL IN MULTILAYER ELECTRONIC PACKAGING AND PRINTED CIRCUIT BOARDS

BACKGROUND OF THE INVENTION

1. Field of the Invention

The present invention generally relates to electronic packaging and printed circuit boards. More particularly, the present invention provides a technique for adjusting clearance hole size for impedance control in multilayer electronic packaging and printed circuit boards.

2. Related Art

As the demand for electronic systems supporting high speed signals continues to increase, there is a need to design chip to chip interconnect hardware using wave propagation physics such that signals are not distorted when traveling through a chip, electronic package, and/or printed circuit board. Currently, in multilayer electronic packages or printed circuit boards, a clearance hole in the power or ground plane is provided around a signal via interconnect and is manufactured purely based on mechanical considerations. Unfortunately, in many cases, the size of the clearance hole around the signal via interconnect is too small, which causes an increase in localized capacitance for the signal via interconnect. The higher the number of layers the signal via interconnect traverses in a multilayer structure, the larger the value of the unwanted capacitance. The extra capacitance causes a lowering of the characteristic impedance of the signal line connection, which is typically optimally designed to be 50 Ohms (100 Ohms differential impedance). Conversely, if the size of the clearance hole around the via signal interconnect is too large, the characteristic impedance of the signal line connection may increase to a value over the optimum value of 50 Ohms (100 Ohms differential impedance). Deviations in the characteristic impedance due to such localized capacitance variations cause reflection of the propagating signal at those points and a higher return loss (i.e., the ratio of the reflected signal to the incident signal). Accordingly, there is a need for a technique for adjusting clearance hole size for impedance control in multilayer electronic packaging and printed circuit boards that obviates these and other problems associated with the prior art.

SUMMARY OF THE INVENTION

The present invention provides a technique for adjusting clearance hole (a.k.a., "antipad") size for impedance control in multilayer electronic packaging and printed circuit boards. In particular, in accordance with an embodiment of the present invention, the size of the clearance hole around a signal via interconnect (or a pair of signal via interconnects) is adjusted to obtain the desired 50 Ohm characteristic impedance for a single signal via interconnect or 100 Ohm differential characteristic impedance for a pair of signal via interconnects forming a differential connection. The diameter/size of the signal via interconnect(s) and/or the pitch of the signal via interconnects can also be adjusted to provide the desired characteristic impedance. Adjustment of the diameter/size and/or pitch of the signal via interconnects(s) may be necessary, for example, if the maximum size of clearance hole that is supportable in a given technology is reached.

A first aspect of the present invention is directed to a method for impedance control, comprising: providing parameters for a structure having a clearance hole and at least one via passing through the clearance hole; calculating a characteristic impedance for the at least one via; and adjusting at least a size of the clearance hole until the characteristic impedance for the at least one via is approximately equal to a desired characteristic impedance.

A second aspect of the present invention is directed to a system for impedance control, comprising: means for providing parameters for a structure having a clearance hole and at least one via passing through the clearance hole; means for calculating a characteristic impedance for the at least one via; and means for adjusting at least a size of the clearance hole until the characteristic impedance for the at least one via is approximately equal to a desired characteristic impedance.

A third aspect of the present invention is directed to a method for impedance control, comprising: calculating a characteristic impedance for at least one via passing through a clearance hole in a structure; and adjusting at least a size of the clearance hole until the characteristic impedance for the at least one via is approximately equal to a desired characteristic impedance.

BRIEF DESCRIPTION OF THE DRAWINGS

These and other features of this invention will be more readily understood from the following detailed description of the various aspects of the invention taken in conjunction with the accompanying drawings in which.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

The present invention provides a technique for adjusting clearance hole size for impedance control in multilayer electronic packaging and printed circuit boards. In accordance with the present invention, the size of the clearance hole around a signal via interconnect (or a pair of signal via interconnects) is adjusted to obtain the desired 50 Ohm characteristic impedance for a single signal via interconnect or 100 Ohm differential characteristic impedance for a pair of signal via interconnects forming a differential connection. The diameter/size of the signal via interconnect(s) and/or the pitch of the signal via interconnects can also be adjusted to provide the desired characteristic impedance.

Figure 1:
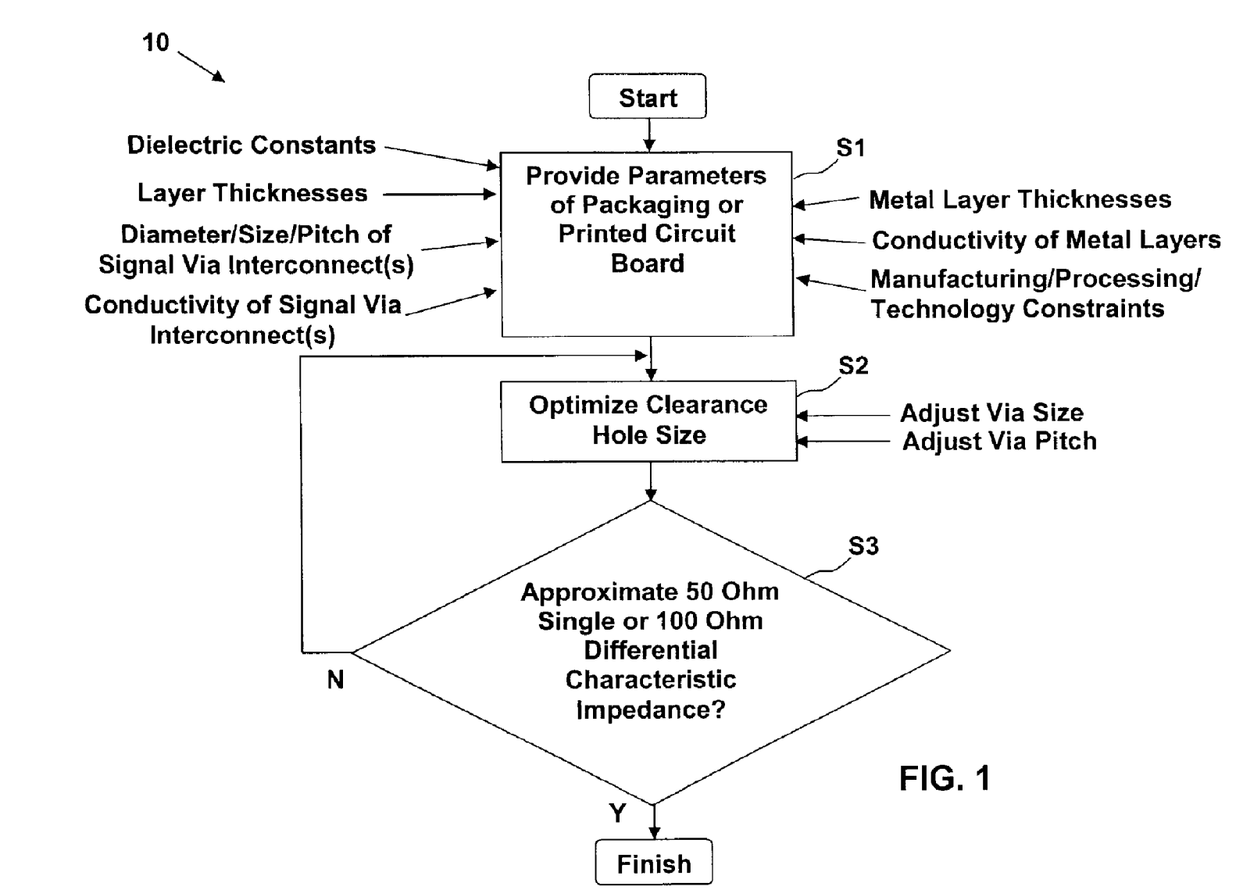
FIG. 1 depicts a flow diagram of a method in accordance with an embodiment of the present invention.

A flow diagram 10 of a method in accordance with an embodiment of the present invention is depicted in FIG. 1. In step S1, parameters are provided for the structure in question (e.g., packaging or printed circuit board) in order to compute the optimum clearance hole size. The parameters can include, for example, the dielectric constants of the material(s) used in the structure, the layer thicknesses of the layers in the multilayer stack forming the structure, the diameter/size/pitch of the signal via interconnect(s), the conductivity of the metal of the signal via interconnect(s), the thicknesses of the metal layer(s) in the structure, the conductivity of the metal acting as the ground or shielding layer between the dielectric layers of the structure, etc. The parameters are input into a electromagnetic field solver or other suitable analytical/measurement system to determine/simulate the optimum clearance hole size needed to provide the desired characteristic impedance. Information regarding manufacturing/processing/technology constraints can also be provided.

Figure 2:
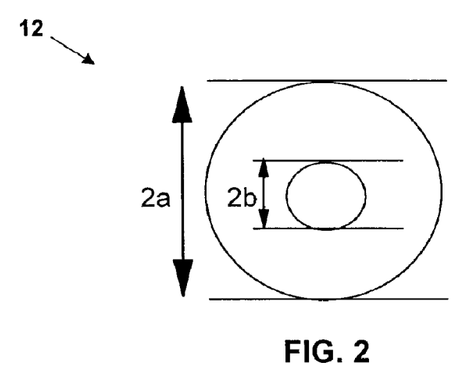
FIG. 2 depicts a cross-section of a coaxial cable.
Figure 3:
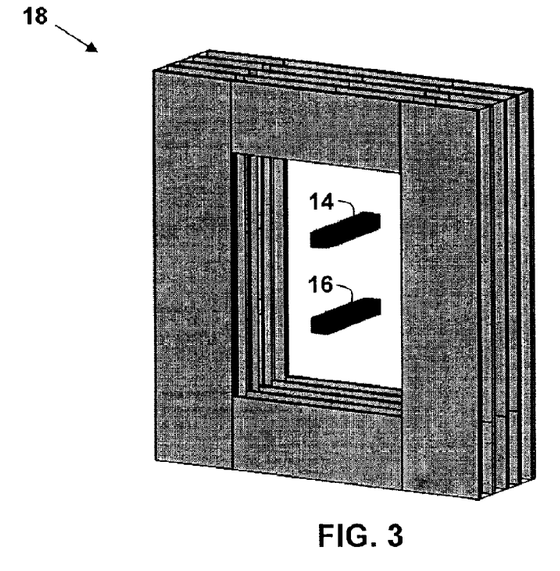
FIG. 3 depicts a perspective view of a differential connection through a multilayer structure.

If multiple ground planes did not exist in the structure, the computation of the optimum clearance hole size required to provide the desired characteristic impedance would be similar to that of the inner dimensions of a 50 Ohm coaxial cable, where the equation for impedance would be:

$$Z_0 = \frac{1}{2\pi}\left(\frac{\mu_0}{\varepsilon}\right)^{\frac{1}{2}} \ln\left(\frac{b}{a}\right) \quad (1)$$

where $\varepsilon$ is the dielectric constant of the packaging or printed circuit board material and $\mu_o$ is the permeability of free space. The dimensions 'a' and 'b' of such a coaxial cable 12 are shown in FIG. 2. However, as seen in FIG. 3, when there are two signal via interconnects 14, 16 forming a differential connection through a multilayer structure 18, the outer ground return is not continuous as it is in the coaxial outer shield case. Rather, the ground planes that constitute the ground return are connected with vias at either uniform or non-uniform points. As a result, in order to compute the optimum hole size, Maxwell's equations have to be solved (e.g., using numerical techniques) using appropriate boundary conditions (e.g., using the parameters provided in step S1). (There is no simple closed form analytical expression that can be used, as was the case with the coaxial cable 12.) The two related Maxwell's equations to be solved are:

$$\nabla x E = -\frac{\partial B}{\partial t} \quad (2)$$

$$\nabla x H = \frac{\partial D}{\partial t} \quad (3)$$

wherein E is the electromagnetic field, B is the magnetic field, H is the magnetic field strength, and D is the electric displacement.

An iterative process (steps S2 and S3, FIG. 1) can be carried out to home in on the optimum clearance hole size needed to provide a characteristic impedance of 100 Ohms for a pair of signal via interconnects forming a differential connection or 50 Ohms for a single signal via interconnect. This can be done, for example, by selectively varying the size of the clearance hole until the desired characteristic impedance is obtained. In addition, or alternatively, the iterative process (steps S2 and S3, FIG. 1) can be carried out while adjusting the size/diameter of the signal via interconnect(s) and/or the pitch of the signal via interconnects to provide the desired characteristic impedance.

An application of the present invention to a multilayer structure 20 having a pair of signal via interconnects 22, 24 forming a differential connection is illustrated in FIGS. 4-7. In this example, the pair of signal via interconnects 22, 24 are disposed in a clearance hole 26. The multilayer structure 20 includes a plurality of ground planes that are interconnected by a plurality (e.g., four) of outer vias 28.

Figure 4:
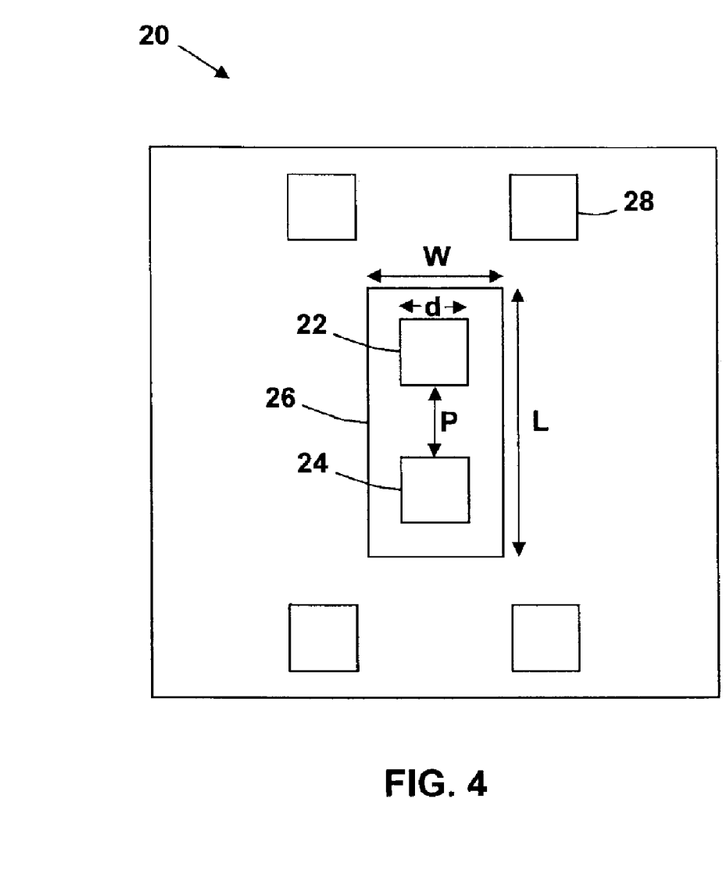
FIG. 4 depicts a cross-section of a differential connection through a multilayer structure.
Figure 5:
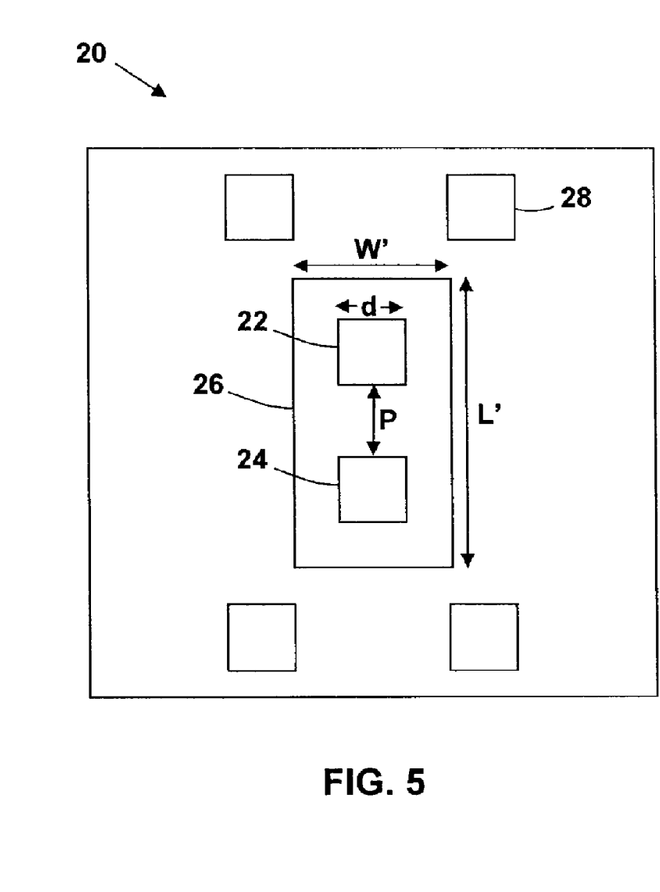
FIGS. 5-7 depict various applications of a method in accordance with an embodiment of the present invention to the multilayer structure of FIG. 4.

In FIG. 4, it is assumed that the characteristic impedance of the multilayer structure 20 is found to be approximately 60 Ohms, which deviates substantially from the desired 100 Ohm differential characteristic impedance target. To increase the characteristic impedance of the multilayer structure 20, the size of the clearance hole 26 can be changed (e.g., iteratively) until the characteristic impedance reaches a value of approximately 100 Ohm. Comparing FIGS. 4 and 5, for example, it can be seen that the width of the clearance hole 26 has been increased from W to W', while the length of the clearance hole 26 has been increased from L to L'. In general, one or more dimensions of the clearance hole 26 can be changed (i.e., increased or decreased) to adjust the characteristic impedance of the multilayer structure 20.

Figure 6:
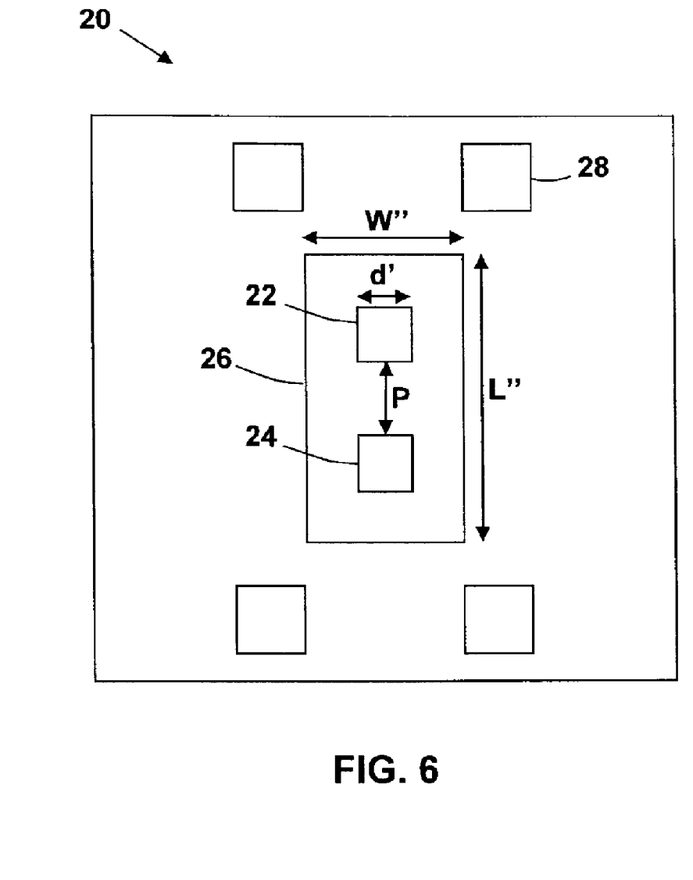
Figure 7:
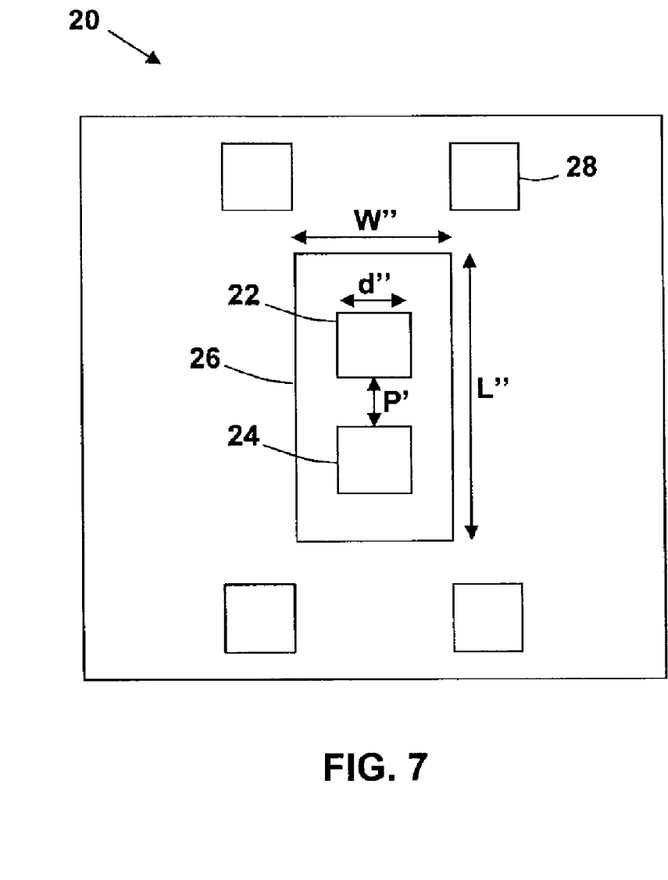

In a similar manner, comparing FIGS. 4 and 6, the size of the signal via interconnects 22, 24 forming the differential connection can be changed (e.g., iteratively) to adjust the characteristic impedance of the multilayer structure 20. This can be done in conjunction with, or separately from, a change in the size of the clearance hole 26. In FIG. 6, for example, both the size of the clearance hole 26 itself, as well as the size of the signal via interconnects 22, 24 have been changed. In particular, the width and length of clearance hole 26 has been increased from W to W" and from L to L", respectively, while the size of the signal via interconnects 22, 24 forming the differential connection has been reduced from d to d'. In this example, the pitch P of the of the signal via interconnects 22, 24 forming the differential connection has not been changed. However, if desired/needed, as shown in FIG. 7, the pitch P of the signal via interconnects 22, 24 forming the differential connection can be changed (e.g., iteratively) in conjunction with, or separately from, a change in the size of the clearance hole 26 and/or a change in the size of the signal via interconnects 22, 24. In FIG. 7, for example, the width and length of clearance hole 26 has been increased from W to W" and from L to L", respectively, the size of the signal via interconnects 22, 24 forming the differential connection has been increased from d to d", while the pitch of the signal via interconnects 22, 24 forming the differential connection has been decreased from P to P'.

Figure 8:
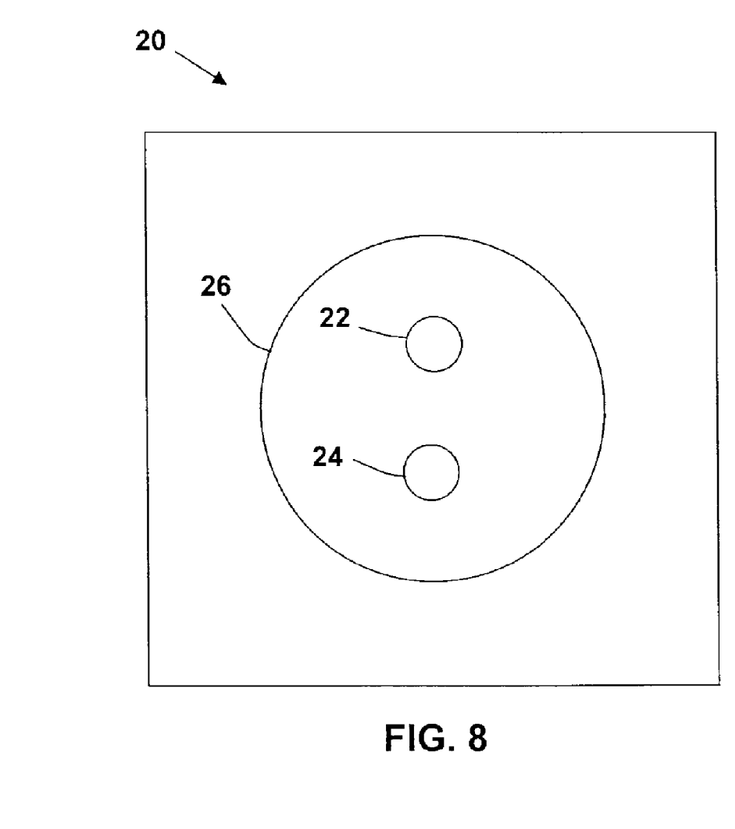
FIG. 8 depicts a cross-section of a differential connection through a multilayer structure, wherein the signal via interconnects and the clearance hole have circular configurations.

In this example, it is assumed that the clearance hole 26 has a polygonal structure (e.g., rectangular), although this need not be the case. For example, as shown in FIG. 8, the clearance hole 26 can be circular, oval, etc. Similarly, the signal via interconnects 22, 24 can also be circular, oval, etc.

Figure 9:
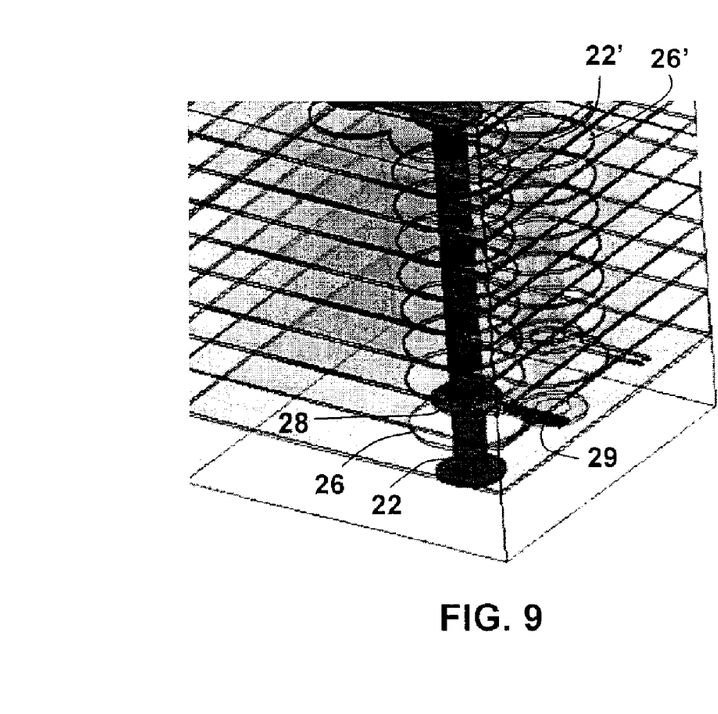
FIG. 9 depicts a clearance hole around a single signal via interconnect.

An example of a clearance hole 26 around a single signal via interconnect 22 having a desired characteristic impedance of 50 Ohms is illustrated in FIG. 9. A differential connection can be provided by using the single signal via interconnect 22 in clearance hole 26 and the single via interconnect 22' (shown in phantom) in clearance hole 26'. Another point to be noted with regard to FIG. 9 is that the dimensions of the flat discs 28 (a.k.a., "pads") where a signal line 29 attaches to a signal via interconnect (e.g., signal via interconnect 22) and on the top and bottom of a signal via interconnect can also be manipulated when optimizing the characteristic impedance of the structure.

Figure 10:
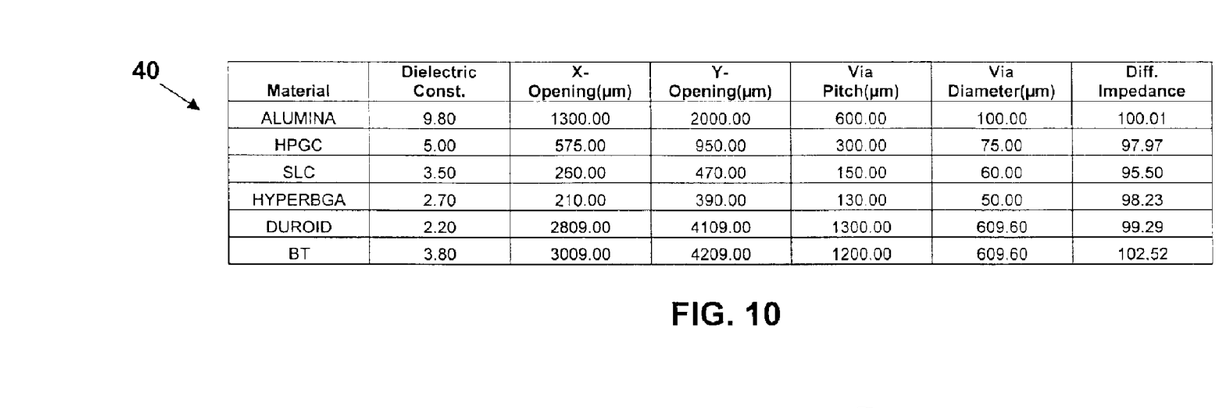
FIG. 10 depicts an illustrative table of relative dimensions required to provide a 100 Ohm differential characteristic impedance target value for multilayer structures formed using different packaging and printed circuit board technologies.
Figure 11:
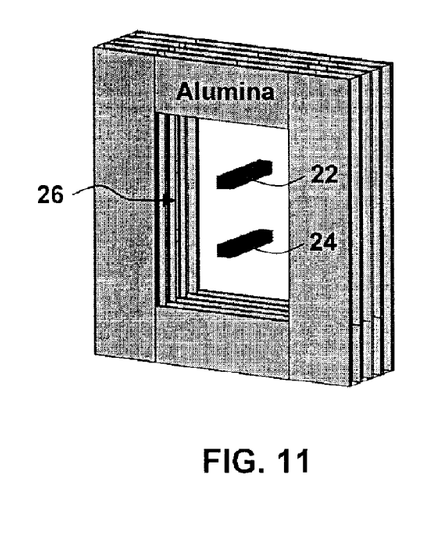
FIGS. 11-16 depict the multilayer structures described in the table of FIG. 10.
Figure 12:
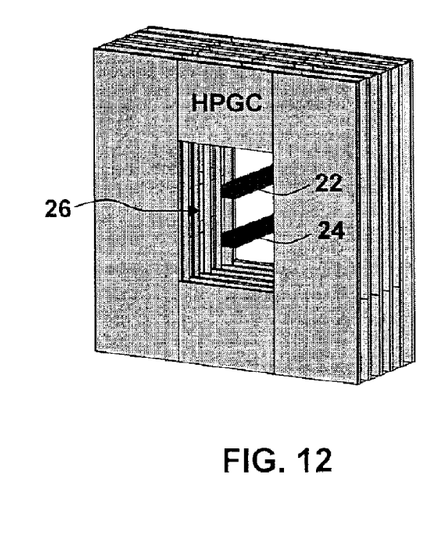
Figure 13:
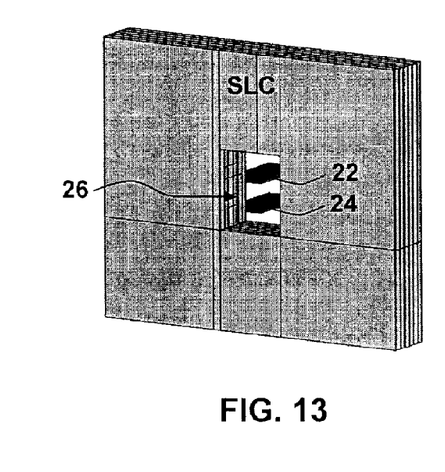
Figure 14:
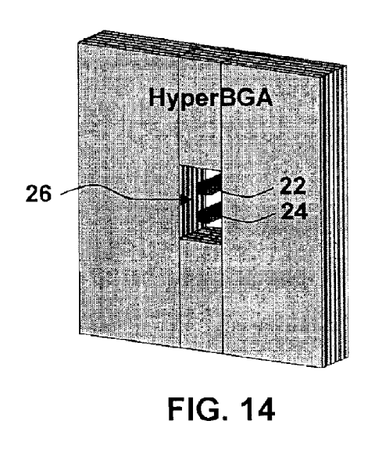
Figure 15:
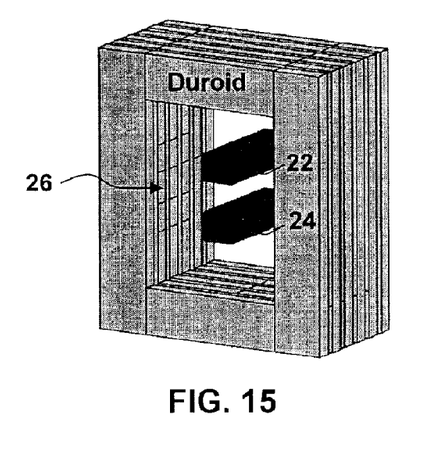
Figure 16:
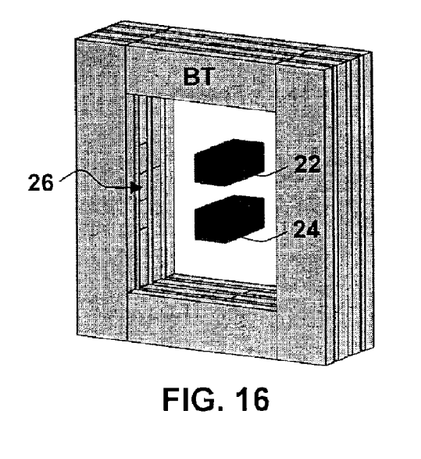

The table 30 depicted in FIG. 10 illustrates examples of the relative dimensions of the clearance hole 26, signal via interconnects 22, 24, and pitch of the signal via interconnects 22, 24 required to provide a 100 Ohm differential characteristic impedance target value for multilayer structures 20 formed using different packaging and printed circuit board technologies. In this example, the packaging and printed circuit board technologies comprise: Alumina, HPGC (High-Performance Glass-Ceramic), SLC (Surface Laminar Circuit), HyperBGA, Duroid, and BT (bismaleimide triazine resin). The resultant multilayer structures 20 are depicted in FIGS. 11-16, respectively. Comparing FIGS. 11-16 in view of the data in table 30, it will be apparent to one skilled in the art that the size of the clearance hole 26 required to provide a 100 Ohm differential characteristic impedance target value can vary greatly for different packaging and printed circuit board technologies. The same holds true for the size/pitch of the signal via interconnects 22, 24.

Figure 17:
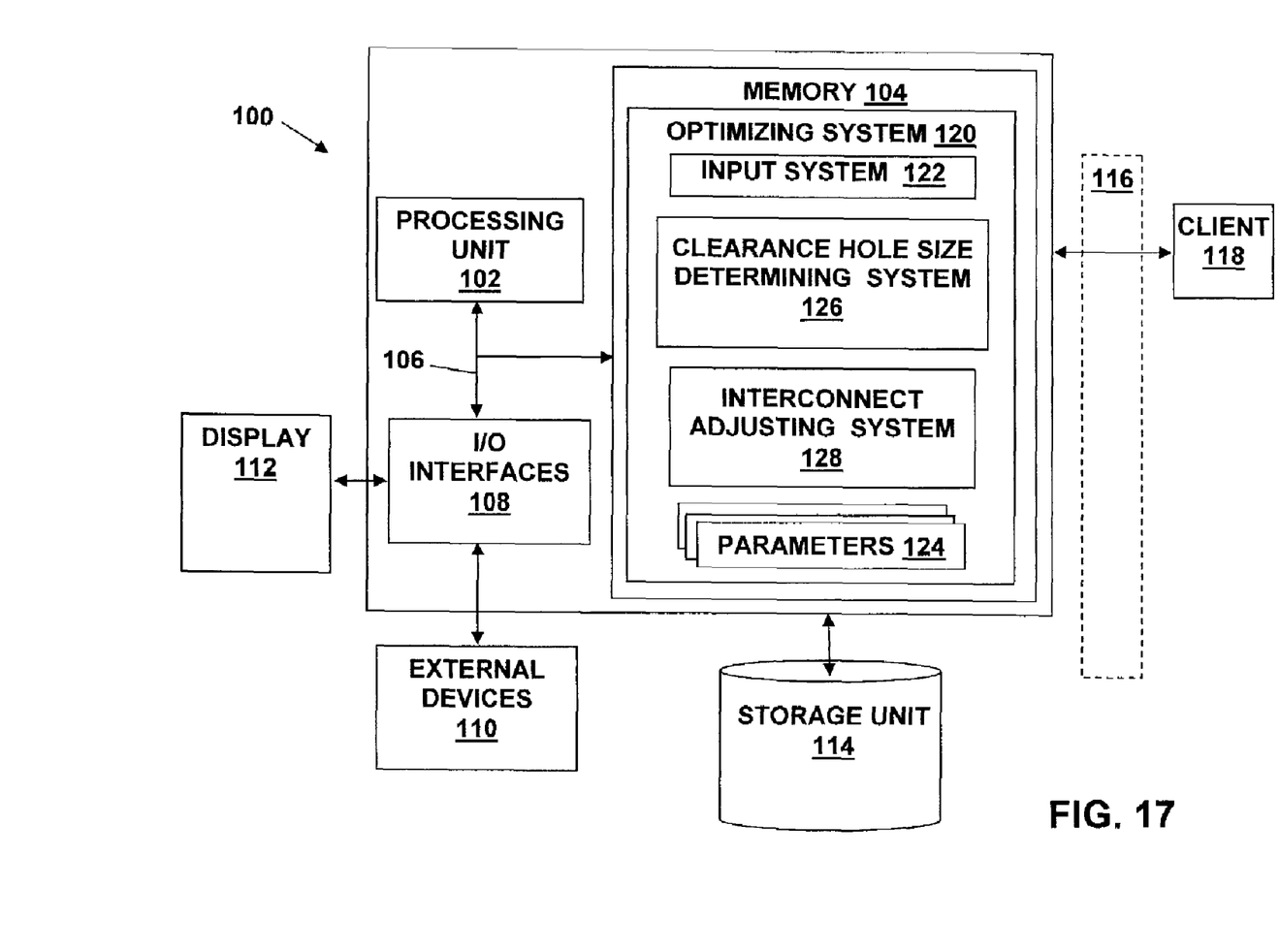
FIG. 17 depicts an illustrative computer system for implementing a method in accordance with an embodiment of the present invention.

A computer system 100 for implementing a method in accordance with an embodiment of the present invention is depicted in FIG. 17. Computer system 100 generally includes a processing unit 102, memory 104, bus 106, input/output (I/O) interface(s) 108, and external devices/resource(s) 110. Processing unit 102 may comprise a single processing unit, or may be distributed across one or more processing units in one or more locations. Memory 104 may comprise any known type of data storage and/or transmission media, including magnetic media, optical media, random access memory (RAM), read-only memory (ROM), etc. Moreover, similar to processing unit 102, memory 104 may reside at a single physical location, comprising one or more types of data storage, or be distributed across a plurality of physical systems in various forms.

I/O interface(s) 108 may comprise any system for exchanging information to/from an external source. External devices/resource(s) 110 may comprise any known type of external device, including speakers, a handheld device, keyboard, mouse, voice recognition system, speech output system, printer, monitor/display (e.g., display 112), facsimile, pager, etc.

Bus 106 provides a communication link between each of the components in computer system 100, and likewise may comprise any known type of transmission link, including electrical, optical, wireless, etc. In addition, although not shown, additional components, such as cache memory, communication systems, system software, etc., may be incorporated into computer system 100.

Data (e.g., packaging and printed circuit board parameters, clearance hole sizes, signal via interconnects sizes/pitches, etc.) used in the practice of the present invention can be stored locally to computer system 100, for example, in storage unit 114, and/or may be provided to computer system 100 over a network 116. Storage unit 114 can be any system capable of providing storage for data and information under the present invention. As such, storage unit 114 may reside at a single physical location, comprising one or more types of data storage, or may be distributed across a plurality of physical systems in various forms. In another embodiment, storage unit 114 may be distributed across, for example, a local area network (LAN), wide area network (WAN) or a storage area network (SAN) (not shown).

Network 116 is intended to represent any type of network over which data can be transmitted. For example, network 116 can include the Internet, a wide area network (WAN), a local area network (LAN), a virtual private network (VPN), a WiFi network, or other type of network. To this extent, communication can occur via a direct hardwired connection or via an addressable connection in a client-server (or server-server) environment that may utilize any combination of wireline and/or wireless transmission methods. In the case of the latter, the server and client may utilize conventional network connectivity, such as Token Ring, Ethernet, WiFi or other conventional communications standards. Where the client communicates with the server via the Internet, connectivity could be provided by conventional TCP/IP sockets-based protocol. In this instance, the client would utilize an Internet service provider to establish connectivity to the server. One or more client devices 118 may be connected to computer system 100 via network 116. Each client device 118 comprises components similar to those described above with regard to computer system 100.

Shown in memory 104 as a computer program product is an optimizing system 120 for optimizing the size of a clearance hole 26 in accordance with an embodiment of the present invention. Optimizing system 120 includes an input system 122 for inputting/providing the parameters 124 of the structure (e.g., packaging or printer circuit board) in which the clearance hole 26 is to be located, and a clearance hole size determining system 126 for determining (e.g., iteratively) the size of the clearance hole 26 required to provide a desired characteristic impedance, based on the parameters 124. Also shown in memory 104 is an interconnect adjusting system 128 for adjusting, if necessary, the size/pitch of the signal via interconnects 22, 24 in conjunction with, or separately from, a change in the size of the clearance hole 26 in order to provide the desired characteristic impedance.

It should also be understood that the present invention can be realized in hardware, software, a propagated signal, or any combination thereof. Any kind of computer/server system(s)—or other apparatus adapted for carrying out the methods described herein—is suitable. A typical combination of hardware and software could be a general purpose computer system with a computer program that, when loaded and executed, carries out the respective methods described herein. Alternatively, a specific use computer, containing specialized hardware for carrying out one or more of the functional tasks of the invention, could be utilized. The present invention can also be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method for impedance control, comprising:
providing parameters for a structure having a clearance hole and a pair of vias passing through the clearance hole;
calculating a characteristic impedance for the vias; and
iteratively adjusting a pitch of the vias, a size of the clearance hole, and at least one dimension of at least one of the vias, until the characteristic impedance for the vias is approximately equal to a desired characteristic impedance.

2. The method of claim 1, wherein the structure is selected from the group consisting of an electronic package and a printed circuit board.

3. The method of claim 1, wherein the structure is a multilayer structure.

4. A method for impedance control, comprising:
providing parameters for a structure having a clearance hole and a pair of vias passing through the clearance hole;
calculating a characteristic impedance for the vias; and
iteratively adjusting a pitch of the vias, a size of the clearance hole, and at least one dimension of at least one of the vias, until the characteristic impedance for the vias is approximately equal to a desired characteristic impedance;
wherein the pair of vias passing through the clearance hole form a differential connection, and wherein the desired characteristic impedance is approximately 100 Ohms.

5. A system for impedance control, comprising:
means for providing parameters for a structure having a clearance hole and a pair of vias passing through the clearance hole;
means for calculating a characteristic impedance for the vias; and
means for iteratively adjusting a pitch of the vias, a size of the clearance hole, and at least one dimension of at least one of the vias, until the characteristic impedance for the vias is approximately equal to a desired characteristic impedance.

6. The system of claim 5, wherein the structure is selected from the group consisting of an electronic package and a printed circuit board.

7. The system of claim 5, wherein the structure is a multilayer structure.

8. A system for impedance control, comprising:
means for providing parameters for a structure having a clearance hole and a pair of vias passing through the clearance hole;
means for calculating a characteristic impedance for the vias; and
means for iteratively adjusting a pitch of the vias, a size of the clearance hole, and at least one dimension of at least one of the vias, until the characteristic impedance for the vias is approximately equal to a desired characteristic impedance;
wherein the pair of vias passing through the clearance hole form a differential connection, and wherein the desired characteristic impedance is approximately 100 Ohms.

9. A method for impedance control, comprising:
calculating a characteristic impedance for a pair of vias passing through a clearance hole in a structure; and
iteratively adjusting a pitch of the vias, a size of the clearance hole, and at least one dimension of at least one of the vias, until the characteristic impedance for the vias is approximately equal to a desired characteristic impedance.

10. The method of claim 9, wherein the structure is a multilayer structure.

11. A method for impedance control, comprising:
calculating a characteristic impedance for a pair of vias passing through a clearance hole in a structure; and
iteratively adjusting a pitch of the vias, a size of the clearance hole, and at least one dimension of at least one of the vias, until the characteristic impedance for the vias is approximately equal to a desired characteristic impedance;
wherein the pair of vias passing through the clearance hole form a differential connection, and wherein the desired characteristic impedance is approximately 100 Ohms.

* * * * *